(12) United States Patent
Lin et al.

(10) Patent No.: US 9,449,679 B2
(45) Date of Patent: *Sep. 20, 2016

(54) MEMORY DEVICES AND CONTROL METHODS THEREOF

(71) Applicant: MediaTek Inc., Hsin-Chu (TW)

(72) Inventors: Shu-Hsuan Lin, Hsinchu (TW); Chia-Wei Wang, Taichung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/680,289

(22) Filed: Apr. 7, 2015

(65) Prior Publication Data

US 2015/0213879 A1    Jul. 30, 2015

Related U.S. Application Data

(63) Continuation of application No. 13/869,171, filed on Apr. 24, 2013, now Pat. No. 9,025,394.

(60) Provisional application No. 61/641,709, filed on May 2, 2012.

(51) Int. Cl.
| | | |
|---|---|---|
| *G11C 7/00* | (2006.01) | |
| *G11C 11/418* | (2006.01) | |
| *G11C 7/12* | (2006.01) | |
| *G11C 11/417* | (2006.01) | |
| *G11C 29/02* | (2006.01) | |
| *G11C 11/41* | (2006.01) | |

(52) U.S. Cl.
CPC .............. *G11C 11/418* (2013.01); *G11C 7/12* (2013.01); *G11C 11/417* (2013.01); *G11C 29/021* (2013.01); *G11C 29/028* (2013.01); *G11C 11/41* (2013.01)

(58) Field of Classification Search
CPC .......... G11C 5/147; G11C 5/145; G11C 7/12
USPC ............ 365/189.09, 230.03, 154, 210.14
See application file for complete search history.

(56) References Cited

U.S. PATENT DOCUMENTS

| | | | |
|---|---|---|---|
| 7,966,443 B2 | 6/2011 | Grundy et al. | |
| 8,325,511 B2 | 12/2012 | Seshadri | |
| 8,422,270 B2 | 4/2013 | Kawabata et al. | |
| 9,025,394 B2* | 5/2015 | Lin .......................... | G11C 7/12 365/154 |
| 2007/0133303 A1* | 6/2007 | Mawatari ............... | G11C 16/26 365/185.23 |
| 2007/0279966 A1 | 12/2007 | Houston | |
| 2011/0261609 A1 | 10/2011 | Seshadri | |

FOREIGN PATENT DOCUMENTS

| | | |
|---|---|---|
| CN | 102142275 | 8/2011 |
| CN | 102194524 | 9/2011 |

* cited by examiner

*Primary Examiner* — Don Dinh
(74) *Attorney, Agent, or Firm* — McClure, Qualey & Rodack, LLP (57) ABSTRACT

A memory device includes a first signal line; a memory cell array divided into a first area and a second area and having a plurality of first memory cells and second memory cells in the first area and second area, respectively. The plurality of first and second memory cells are coupled the first signal line, and each has a reference node. A first voltage adjustment circuit adjusts voltages at the reference nodes of the plurality of first memory cells, wherein the first voltage adjustments circuit includes: a first switch coupled between the reference nodes of the plurality of first memory cells and the ground, controlled by an address signal; and a first bias element coupled to the reference nodes of the plurality of first memory cells. A second voltage adjustment circuit adjusts voltages at the reference nodes of the plurality of second memory cells.

15 Claims, 5 Drawing Sheets

MEMORY DEVICES AND CONTROL METHODS THEREOF

CROSS REFERENCE TO RELATED APPLICATIONS

This application is a continuation of pending U.S. application Ser. No. 13/869,171, filed on Apr. 24, 2013, which claims the benefit of U.S. Provisional Application No. 61/641,709, filed on May 2, 2012, the contents of which are incorporated herein by reference.

BACKGROUND OF THE INVENTION

1. Field of the Invention

The invention relates to a memory device, and more particularly, to a memory device with low power and high density design.

2. Description of the Related Art

For SRAM devices, leakage currents on bit lines affect power consumption and further affect read margins of read operations. In order to decrease leakage currents on bit lines of SRAM devices, the number of memory cells coupled to each one bit line is limited according to the manufacturing processes utilized. For example, 65 nm and 55 nm processes are required to couple 512 memory cells to each one bit line, and 40 nm and 28 nm processes are required to couple 256 memory cells to each one bit line. For 28 nm processes, coupling less memory cells to each one bit line may decrease leakage currents on the bit lines. However, less number of memory cells coupled to each one bit line of an SRAM device will degrade the density of the memory cells in a memory cell array. In this situation, more bit lines are required to obtain the desirable number of memory cells of the SRAM device, and, thus, additional local control circuits and local input/output circuits are also required, which increases area requirements of the SRAM device.

BRIEF SUMMARY OF THE INVENTION

Thus, it is desirable to provide a memory device which has high density of memory cells and low power consumption.

An exemplary embodiment of a memory device comprises a first signal line, a memory cell array, a first voltage adjustment circuit, and a second voltage adjustment circuit. The memory cell array is divided into a first area and a second area. The memory cell array comprises a plurality of first memory cells in the first area and a plurality of second memory cells in the second area. The plurality of first and second memory cells are coupled the first signal line. Each of the plurality of first and second memory cells has a reference node. The first voltage adjustment circuit adjusts voltages at the reference nodes of the plurality of first memory cells. The second voltage adjustment circuit adjusts voltages at the reference nodes of the plurality of second memory cells. The reference nodes of the plurality of first memory cells are coupled to a ground through the first voltage adjustment circuit. The reference nodes of the plurality of second memory cells are coupled to the ground through the second voltage adjustment circuit.

Another exemplary embodiment of memory device comprises a bit line, a first word line, a second word line, a first memory cell, a second memory cell, a first voltage adjustment circuit, and a second voltage adjustment circuit. The first memory cell is coupled to the bit line and the first word line. The second memory cell is coupled to the bit line and the second word line. Each of the first and second memory cells has a reference node. The first voltage adjustment circuit adjusts a voltage at the reference node of the first memory cell. The second voltage adjustment circuit adjusts a voltage at the reference node of the second memory cell. The reference node of the first memory cell is coupled to a ground through the first voltage adjustment circuit. The reference node of the second memory cell is coupled to the ground through the second voltage adjustment circuit.

An exemplary embodiment of a control method for a memory device is provided. The memory device comprises a bit line and a memory cell array. The memory cell array comprises a plurality of memory cells coupled to the bit line. Each of the memory cells has a reference node. The control method comprises the steps of dividing the memory cell array into a first area and a second area, and adjusting voltages at the reference nodes of the memory cells in the first area to be at a voltage level of a ground and voltages at the reference nodes of the memory cells in the second area to a reference voltage level which is higher than a voltage level of the ground when the memory device has performed the access operation to the first area.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
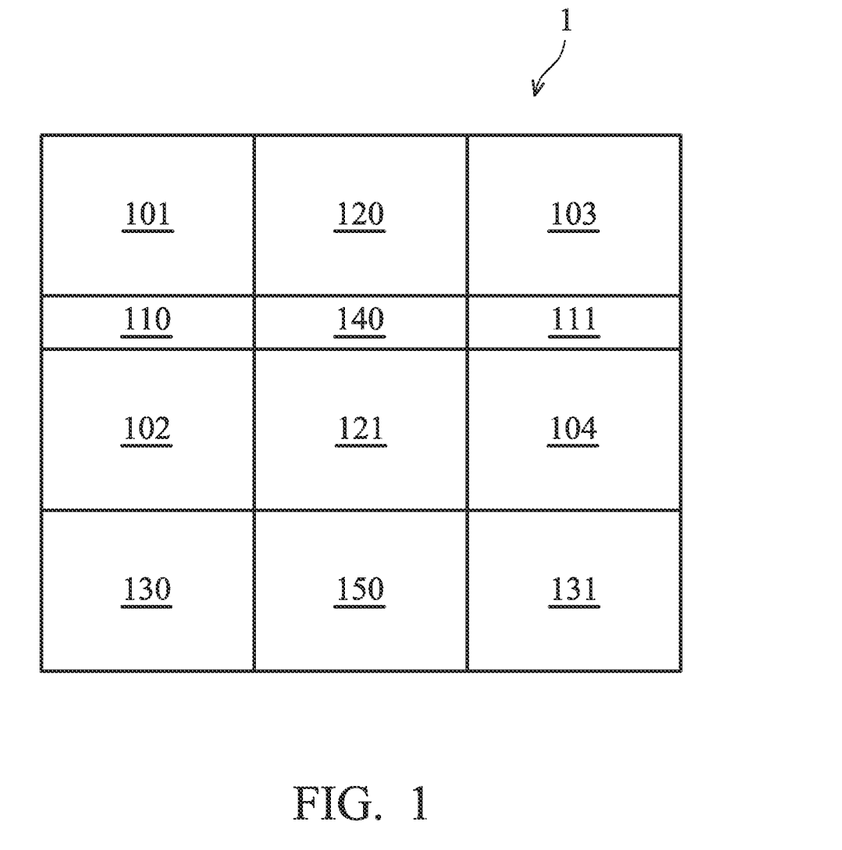
FIG. 1 is a schematic diagram of an exemplary embodiment of a layout of a memory device.
Figure 2:
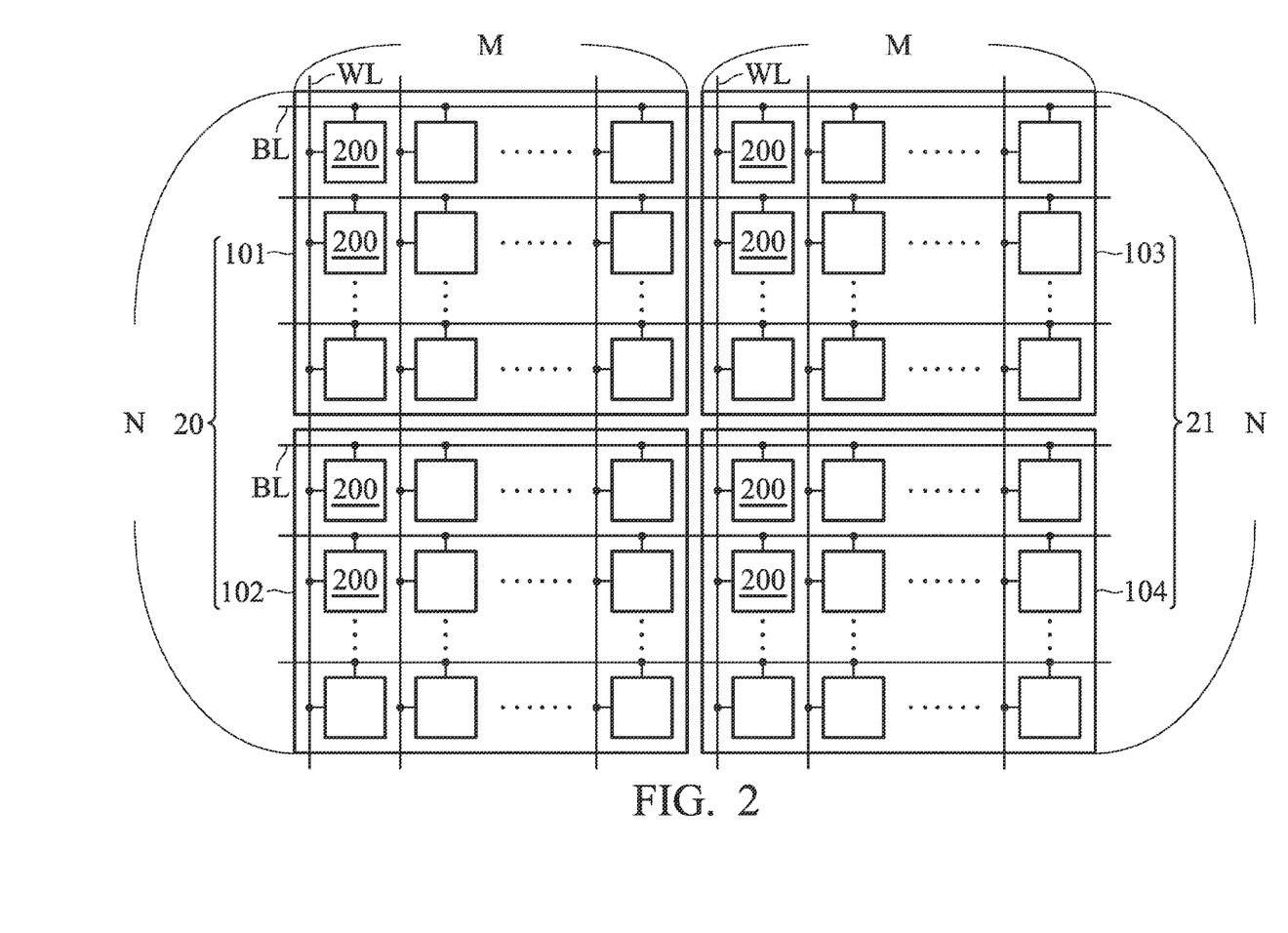
FIG. 2 is a schematic diagram of memory cell arrays in the memory device of FIG. 1.

FIG. 1 is a schematic diagram of an exemplary embodiment of a layout of a memory device. Referring to FIG. 1, a memory device 1 has a layout divided into several areas for different purposes. For example, there are twelve areas of the layout of the memory device 1. In the embodiment, the memory device 1 is an SRAM. The areas 101 and 102 collectively comprise a plurality of memory cells arranged in a memory cell array 20 with M columns and N rows, wherein M≥1 and N≥2, as shown in FIG. 2. In other words, the memory cell array 20 is divided into two areas 101 and 102. In the memory cell array 20 disposed in the areas 101 and 102, the memory cells 200 on the same column are coupled to one bit line BL, and the memory cells on the same row are coupled to one word line WL. Similarly, the areas 103 and 104 collectively comprise a plurality of memory cells arranged in a memory cell array 21 with M columns and N rows, as shown in FIG. 2. In other words, the memory cell array 21 is divided into two areas 103 and 104. In the memory cell array 21 disposed in the areas 103 and 104, the memory cells on the same column are coupled to one bit line BL, and the memory cells on the same row are coupled to one word line WL. As shown in FIG. 2, the area 101 corresponds to the area 103, and the area 102 corresponds to the area 104. Thus, in the areas 101 and 103, the memory cells on the same row are coupled to the same word line WL, and in the areas 102 and 104, the memory cells on the same row are coupled to the same word line WL.

Referring to FIG. 1, among the twelve areas of the layout, word line driver circuits for the areas 101 and 103 are disposed in the area 120, word line driver circuits for the areas 102 and 104 are disposed in the area 121, global input/output (I/O) circuits for the memory cell array 20 (that is the memory cells in the areas 101 and 102) are disposed in the area 130, global I/O circuits for the memory cell array 21 (that is the memory cells in the areas 103 and 104) are disposed in the area 131, control circuitry for voltage adjustment circuits is disposed in the area 140, and control circuits of the memory device 1 are disposed in the area 150.

In the embodiment, to decrease leakage currents on the bit lines, a voltage adjustment circuit is configured for the memory cells coupled to the same bit line in each of the areas 101~104. In detail, among the memory cells coupled to the same bit line BL in the memory cell array 20, two voltage adjustment circuits are configured for the memory cells in the area 101 and the memory cells in the area 102, respectively. Due to the two voltage adjustment circuits, among the memory cells coupled to the same bit line, the memory cells in the area 101 and the memory cells in the area 102 can be separately coupled to a ground. Similarly, among the memory cells coupled to the same bit line BL in the memory cell array 21, two voltage adjustment circuits are configured for the memory cells in the area 103 and the memory cells in the area 104, respectively. Due to the two voltage adjustment circuits, among the memory cells coupled to the same bit line, the memory cells in the area 103 and the memory cells in the area 104 can be separately coupled to the ground. In the following, the operation of the voltage adjustment circuits will be described by taking two memory cells in the area 101 and two memory cells in the area 102 which are coupled to the same bit line. That is, four memory cells in the memory cell array 20 (M=1, N=4) are given as an example.

Figure 3:
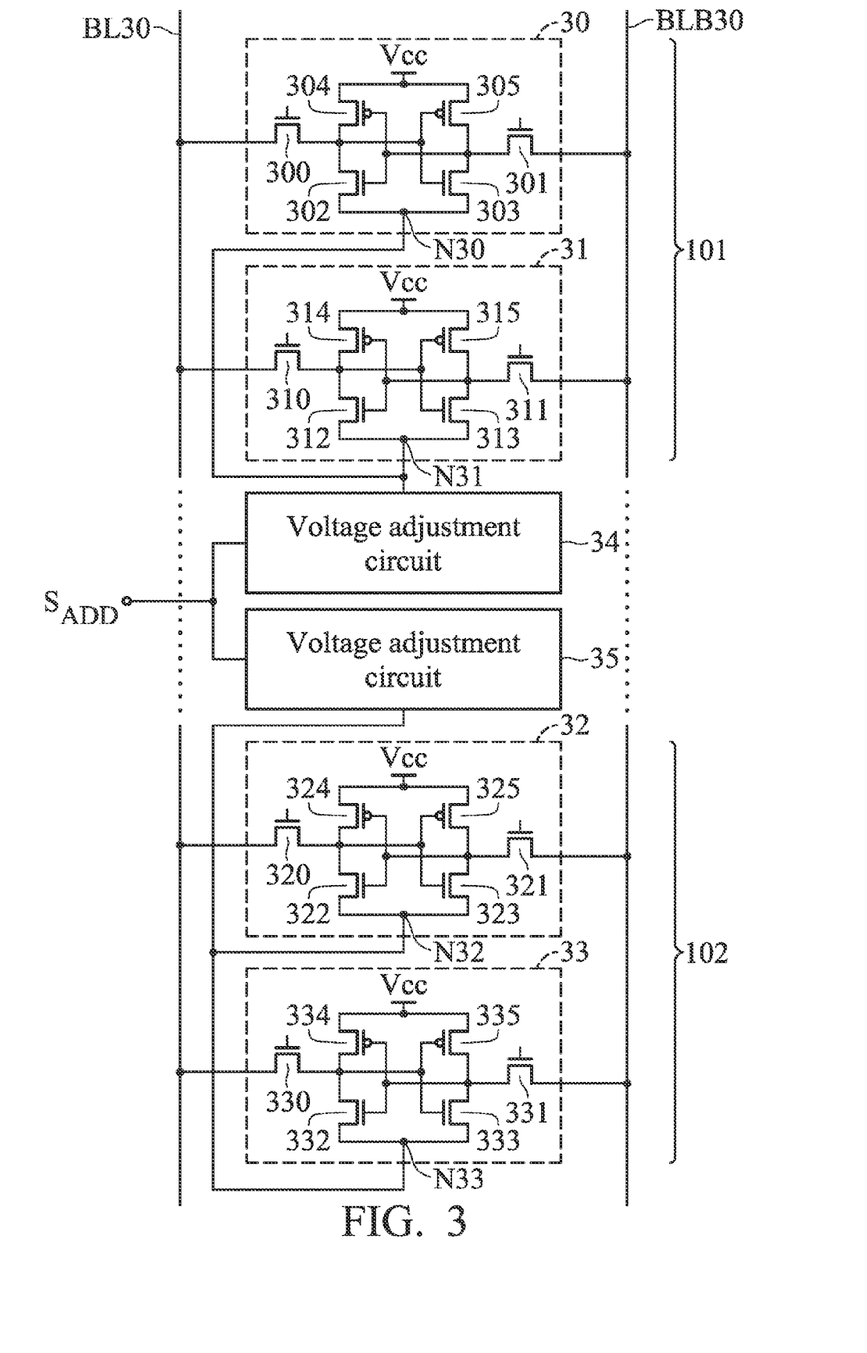
FIG. 3 is a schematic diagram of voltage adjustment circuits and memory cells coupled to the same bit lint in the memory device of FIG. 1.

Referring to FIG. 3, memory cells 30 and 31 in the area 101 are coupled to a bit line BL30 and an inverse bit lint BLB30, and memory cells 32 and 33 in the area 102 are also coupled to the bit line BL30 and the inverse bit lint BLB30. The memory cells 30~33 are coupled to the successive word lines (shown in FIG. 2), respectively. In another embodiment, the word lines coupled to the memory cells 30~33 are not limited to the successive word lines. In the embodiment, each of the memory cells 30~33 is a 6T SRAM cell. As shown in FIG. 3, the memory cell 30 comprises four N-type metal-oxide-semiconductor (NMOS) transistors 300~303 and two P-type MOS (PMOS) transistors 304~305, the memory cell 31 comprises four NMOS transistors 310~313 and two PMOS transistors 314~315, the memory cell 32 comprises four NMOS transistors 320~323 and two PMOS transistors 324~325, and the memory cell 33 comprises four NMOS transistors 330~333 and two PMOS transistors 334~335. The transistors 310~315, the transistors 320~325, and the transistors 330~335 have the same connection structure as the transistors 310~315. The structures of the memory cells 30~33 in FIG. 3 are examples without limi- tation. In other embodiments, the memory cells 30~33 have other SRAM memory cell structures. Each of the memory cells 30~33 has a reference node coupled to a corresponding voltage adjustment circuit. As shown in FIG. 3, in the area 101, the memory cell 30 has a reference node N30 coupled to a voltage adjustment circuit 34, and the memory cell 31 has a reference node N31 coupled to the voltage adjustment circuit 34. The voltage adjustment circuit 34 is coupled between each of the reference nodes N30 and N31 and a ground GND. In the area 102, the memory cell 32 has a reference node N32 coupled to a voltage adjustment circuit 35, and the memory cell 33 has a reference node N33 coupled to the voltage adjustment circuit 35. The voltage adjustment circuit 35 is coupled between each of the reference nodes N32 and N33 and the ground GND. In other words, the reference nodes N30~N33 are not directly connected to the ground GND. The reference nodes N30 and N31 are coupled to the ground GND through the voltage adjustment circuit 34, while the reference nodes N32 and N33 are coupled to the ground GND through the voltage adjustment circuit 35. Both of the voltage adjustment circuits 30 and 31 receive an address signal $S_{ADD}$ which indicates that the memory device 1 is performing an access operation to the area 101 or 102.

When the memory device 1 is performing the access operation to any one memory cell coupled to the bit line BL30 in the area 101, such as the memory cell 31, the voltage adjustment circuit 34 adjusts the voltages at the reference nodes N30 and N31 of the memory cells 30 and 31 to the voltage level of the ground GND according to the address signal $S_{ADD}$. At the same time, the voltage adjustment circuit 35 adjusts the voltages at the reference nodes N32 and N33 of the memory cells 32 and 33 to a reference voltage level which is higher than the voltage level of the ground GND according to the address signal $S_{ADD}$. Since the voltage at the reference node N31 of the memory cell 31 is adjusted to the voltage level of the ground GND, the memory cell 31 can be accessed successfully. Moreover, in the area 102 which the memory device 1 is not performing the access operation to, since the voltage adjustment circuit 35 adjusts the voltages at the reference nodes N32 and N33 of the memory cells 32 and 33 to the reference voltage level, there are no discharging paths between the bit line BL30 and the ground GND in the area 102. Accordingly, when the memory device 1 is performing the access operation to the area 101, the power consumption induced by the leakage currents in the area 102 can be eliminated.

On the contrary, when the memory device 1 is performing the access operation to any one memory cell coupled to the bit line BL30 in the area 102, such as the memory cell 33, the voltage adjustment circuit 35 adjusts the voltages at the reference nodes N32 and N33 of the memory cells 32 and 33 to the voltage level of the ground GND according to the address signal $S_{ADD}$. At the same time, the voltage adjustment circuit 34 adjusts the voltages at the reference nodes N30 and N31 of the memory cells 30 and 31 to the reference voltage level according to the address signal $S_{ADD}$. Since the voltage at the reference node N33 of the memory cell 33 is adjusted to the voltage level of the ground GND, the memory cell 33 can be accessed successfully. Moreover, in the area 101 which the memory device 1 is not performing the access operation to, since the voltage adjustment circuit 34 adjusts the voltages at the reference nodes N30 and N31 of the memory cells 30 and 31 to the reference voltage level, there are no discharging paths between the bit line BL30 and the ground GND in the area 101. Accordingly, when the memory device 1 performs the access operation to the area 102, the power consumption induced by the leakage currents in the area 101 is eliminated. In FIG. 3, the locations of the voltage adjustment circuits 34 and 35 are shown for the illustration of the of the voltage adjustment circuits. In an embodiment, the arrangement of the voltage adjustment circuits 34 and 35 is shown in FIG. 1, that is the voltage adjustment circuits 34 and 35 are disposed in the area 101 between the areas 101 and 102 where the memory cells 30~33 are disposed.

According to the above embodiments, the memory cells coupled to one bit line are divided into several areas. When the memory device is performing an access operation to one memory cell in one of the areas, the voltages at the reference nodes of the memory cells in the other areas are adjusted to the reference voltage level, such that the leakage currents on the bit line passing through the memory cells in the other areas are nonexistent. Thus, the power consumption can be decreased. Due to the decrement of the power consumption, the number of memory cells coupled to the same bit line is not limited to be a lesser value, such as high density of memory cells in the memory cell arrays 20 and 21 can be achieved.

Figure 4:
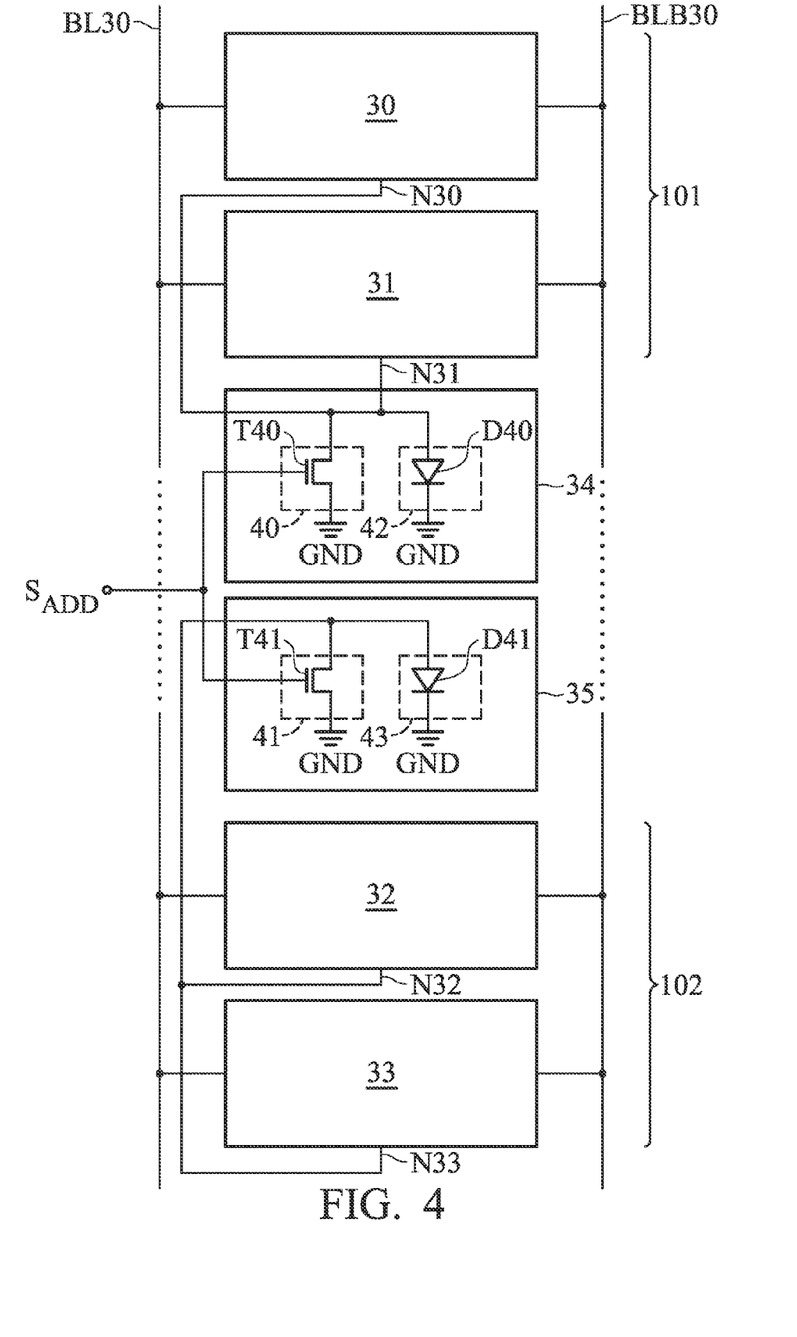
FIG. 4 shows an exemplary embodiment of voltage adjustment circuits in the memory device of FIG. 1.

FIG. 4 shows an exemplary embodiment of the voltage adjustment circuits 34 and 35. Referring to FIG. 4, the voltage adjustment circuits 34 and 35 have the same structure. In order to clearly show the structures of the voltage adjustment circuits 34 and 35 clearly, the structures of the memory cells 30~33 are not shown in FIG. 4. The voltage adjustment circuit 34 comprises a switch 40 and a bias element 42 which are coupled between each of the reference nodes N30 and N31 and the ground GND, and the voltage adjustment circuit 35 comprises a switch 41 and a bias element 43 which are coupled between each of the reference nodes N32 and N33 and the ground GND. In the embodiment of FIG. 4, the switches 40 and 41 are implemented respectively by NMOS transistors T40 and T41, and the bias elements 42 and 43 are implemented respectively by diodes D40 and D41. The gate of the NMOS transistor T40 receives the address signal $S_{ADD}$, the drain thereof is coupled to the reference nodes N30 and N31 of the memory cells 30 and 31, and the source thereof is coupled to the ground GND. The anode of the diode D40 is coupled to the reference nodes N30 and N31 of the memory cells 30 and 31, and the cathode thereof is coupled to the ground GND. The gate of the NMOS transistor T41 receives the address signal $S_{ADD}$, the drain thereof is coupled to the reference nodes N32 and N33 of the memory cells 32 and 33, and the source thereof is coupled to the ground GND. The anode of the diode D41 is coupled to the reference nodes N32 and N33 of the memory cells 32 and 33, and the cathode thereof is coupled to the ground GND.

Referring to FIGS. 3 and 4, when the memory device 1 is performing the access operation to the memory cell 31 in the area 101, the NMOS transistor T40 is turned on according to the address signal $S_{ADD}$, such that the voltages at the reference nodes N30 and N31 of the memory cells 30 and 31 are pulled to the voltage level of the ground GND through the turned-on NMOS transistor T40. At the same time, the NMOS transistor T41 is turned off according to the address signal $S_{ADD}$, and the voltages at the reference nodes N32 and N33 of the memory cells 32 and 33 are pulled to the reference voltage level by the voltage across the diode D41.

On the contrary, when the memory device 1 is performing the access operation to the memory cell 33 in the area 102, the NMOS transistor T41 is turned on according to the address signal $S_{ADD}$, such that the voltages at the reference nodes N32 and N33 of the memory cells 32 and 33 are pulled to the voltage level of the ground GND through the turned-on NMOS transistor T41. At the same time, the NMOS transistor T40 is turned off according to the address signal $S_{ADD}$, and the voltages at the reference nodes N30 and N31 of the memory cells 30 and 31 are pulled to the reference voltage level by the voltage across the diode D40.

Figure 5:
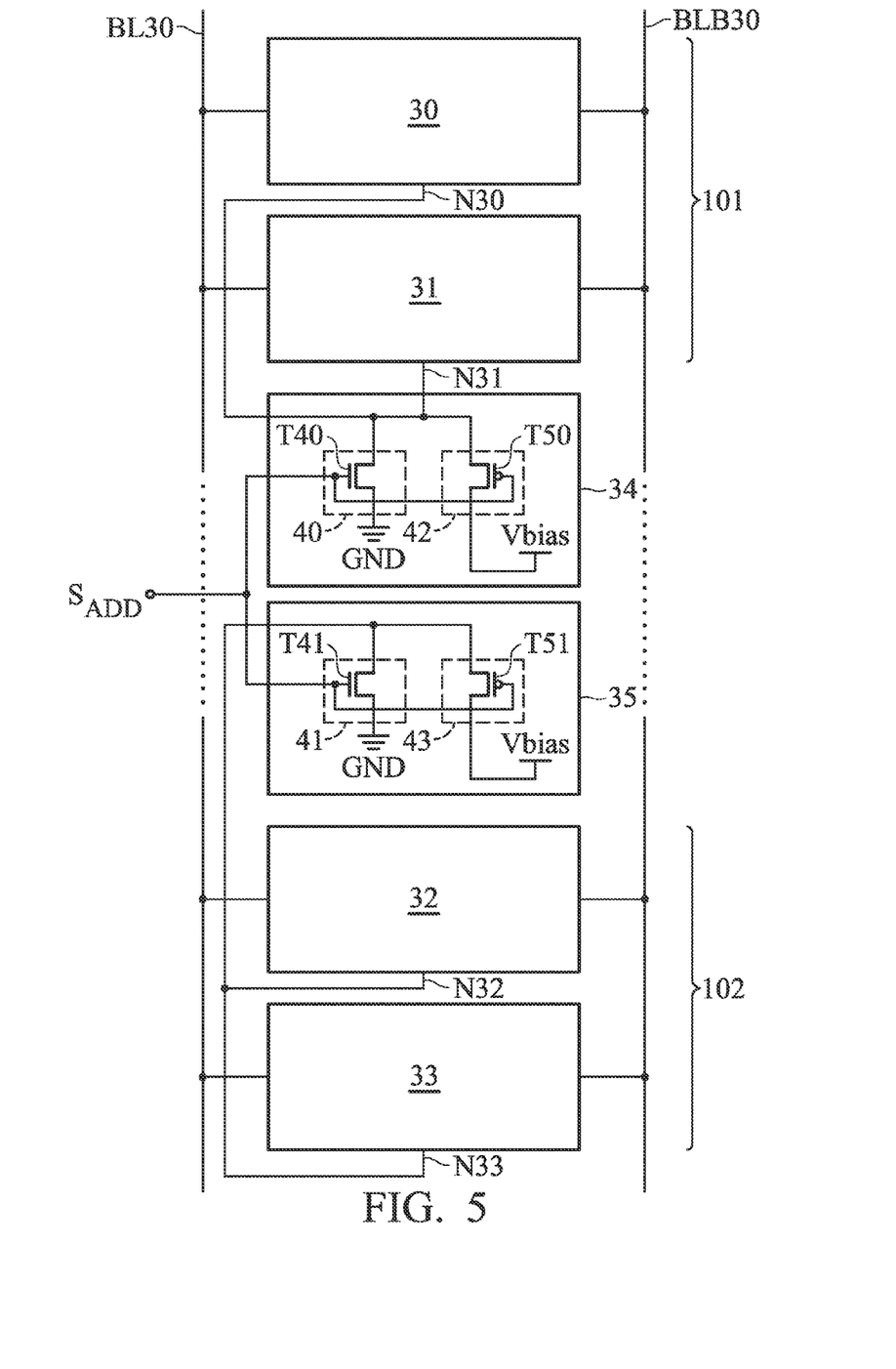
FIG. 5 shows another exemplary embodiment of voltage adjustment circuits in the memory device of FIG. 1.

In another embodiment, the bias elements 42 and 43 are implemented by PMOS transistors T50 and T51 which operate as switches, as shown in FIG. 5. The gate of the PMOS transistor T50 receives the address signal $S_{ADD}$, the source thereof is coupled to the reference nodes N30 and N31 of the memory cells 30 and 31, and the drain thereof is coupled to a voltage source Vbias which provides a bias voltage with the reference voltage level. In the embodiment, the voltage source Vbias provides the bias voltage with 0.3V, that is the reference voltage level is the voltage level of 0.3V. The gate of the PMOS transistor T51 receives the address signal $S_{ADD}$, the source thereof is coupled to the reference nodes N32 and N33 of the memory cells 32 and 33, and the drain thereof is coupled to the voltage source Vbias.

Referring to FIGS. 3 and 5, when the memory device 1 is performing the access operation to the memory cell 31 in the area 101, the NMOS transistor T40 is turned on and the PMOS transistor T50 is turned off according to the address signal $S_{ADD}$, such that the voltages at the reference nodes N30 and N31 of the memory cells 30 and 31 are pulled to the voltage level of the ground GND through the turned-on NMOS transistor T40. At the same time, the NMOS transistor T41 is turned off and the PMOS transistor P51 is turned on according to the address signal $S_{ADD}$, such that the voltages at the reference nodes N32 and N33 of the memory cells 32 and 33 are pulled to the reference voltage level of the bias voltage through the turned-on PMOS transistor P51.

On the contrary, when the memory device 1 performs the access operation to the memory cell 33 in the area 102, the NMOS transistor T41 is turned on and the PMOS transistor T51 is turned off according to the address signal $S_{ADD}$, such that the voltages at the reference nodes N32 and N33 of the memory cells 32 and 33 are pulled to the voltage level of the ground GND through the turned-on NMOS transistor T41. At the same time, the NMOS transistor T40 is turned off and the PMOS transistor T50 is turned on according to the address signal $S_{ADD}$, such that the voltages at the reference nodes N30 and N31 of the memory cells 30 and 31 are pulled to the reference voltage level through the turned-on PMOS transistor T50.

Referring to FIGS. 1 and 2 again, the voltage adjustment circuits which correspond to the bit lines BL in the memory cell array 20 (that is in the areas 101 and 102), such as the voltage adjustment circuits 34 and 35, are disposed in the area 110 between the areas 101 and 102. Similarly, the voltage adjustment circuits which are coupled to the bit lines BL in the memory cell array 21 (that is in the areas 103 and 104) are disposed in the area 111 between the areas 103 and 104. Compared with the prior arts, the area occupied by the voltage adjustment circuits in the memory device 1 is less than the area occupied by the additional local control circuits and local I/O circuits. Thus, the area of the memory device 1 can be smaller.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device comprising:
    a first signal line;
    a memory cell array divided into a first area and a second area and comprising a plurality of first memory cells in the first area and a plurality of second memory cells in the second area, wherein the plurality of first and second memory cells are coupled the first signal line, and each of the plurality of first and second memory cells has a reference node;
    a first voltage adjustment circuit for adjusting voltages at the reference nodes of the plurality of first memory cells, the first voltage adjustments circuit comprises:
    a first switch coupled between the reference nodes of the plurality of first memory cells and the ground, controlled by an address signal, wherein the address signal indicates that the memory device is performing an access operation to the first area or the second area; and
    a first bias element coupled to the reference nodes of the plurality of first memory cells; and
    a second voltage adjustment circuit for adjusting voltages at the reference nodes of the plurality of second memory cells;
    wherein, the reference nodes of the plurality of first memory cells are coupled to a ground through the first voltage adjustment circuit, and the reference nodes of the plurality of second memory cells are coupled to the ground through the second voltage adjustment circuit.

2. The memory device as claimed in claim 1, wherein when the memory device is performing an access operation to the first area, the second voltage adjustment circuit adjusts the voltages at the reference nodes of the plurality of second memory cells of the second area array to be at a reference voltage level which is higher than a voltage level of the ground.

3. The memory device as claimed in claim 2, wherein when the memory device is performing the access operation to the first area, the first voltage adjustment circuit adjusts the voltages at the reference nodes of the plurality of first memory cells in the first area to be at the voltage level of the ground.

4. The memory device as claimed in claim 1, wherein when the memory device is has performing the access operation to the first area, the first switch is turned on according to the address signal to pull the voltages at the reference nodes of the plurality of first memory cells to the voltage level of the ground, and wherein when the memory device is performing the access operation to the second area, the first switch is turned off according to the address signal, and the first bias element pulls the voltages at the reference nodes of the plurality of first memory cells to a reference voltage level which is higher than a voltage level of the ground.

5. The memory device as claimed in claim 1, wherein the first switch is implemented by an N-type transistor.

6. The memory device as claimed in claim 1, wherein the first bias element is implemented by a diode having an anode coupled to the reference nodes of the plurality of first memory cells and a cathode coupled to the ground.

7. The memory device as claimed in claim 1,
    wherein the first bias element is implemented by a second switch, and the second switch is coupled between the reference nodes of the plurality of first memory cells and a voltage source and further controlled by the address signal,
    wherein the voltage source which provides a bias voltage with a reference voltage level which is higher than a voltage level of the ground,
    wherein when the memory device is performing the access operation to the first area, the first switch is turned on according to the address signal to pull the voltages at the reference nodes of the plurality of first memory cells to the voltage level of the ground, and the second switch is turned off according to the address signal, and
    wherein when the memory device is performing the access operation to the second area, the first switch is turned off according to the address signal, and the second switch is turned on according to the address signal to pull the voltages at the reference nodes of the plurality of first memory cells to the reference voltage level.

8. The memory device as claimed in claim 1, wherein the second voltage adjustment circuit comprises:
    a second switch coupled between the reference nodes of the plurality of second memory cells and the ground, controlled by the address signal;
    a second bias element coupled to the reference nodes of the plurality of second memory cells.

9. The memory device as claimed in claim 8,
    wherein when the memory device is performing the access operation to the first area, the first switch is turned on according to the address signal to pull the voltages at the reference nodes of the plurality of first memory cells to the voltage level of the ground, and the second bias element pulls the voltages at the reference nodes of the second memory cells to a reference voltage level which is higher than a voltage level of the ground; and
    wherein when the memory device is performing the access operation to the second area, the second switch is turned on according to the address signal to pull the voltages at the reference nodes of the plurality of second memory cells to the voltage level of the ground, and the first bias element pulls the voltages at the reference nodes of the first memory cells to the reference voltage level.

10. The memory device as claimed in claim 1, wherein the first and second voltage adjustment circuits are disposed between the first and second areas.

11. A memory device comprising:
    a bit line;
    a first word line and a second word line;
    a first memory cell coupled to the bit line and the first word line;
    a second memory cell coupled to the bit line and the second word line, wherein each of the first and second memory cells has a reference node,
    a first voltage adjustment circuit for adjusting a voltage at the reference node of the first memory cell, the first voltage adjustment circuit comprises:
    a first switch coupled between the reference node of the first memory cell and the ground, controlled by an address signal to indicate that the memory device is performing an access operation to the first memory cell or the second memory cell; and
    a first bias element coupled to the reference node of the first memory cell; and
    a second voltage adjustment circuit for adjusting a voltage at the reference node of the second memory cell;
    wherein, the reference node of the first memory cell is coupled to a ground through the first voltage adjustment circuit, and the reference node of the second memory cell is coupled to the ground through the second voltage adjustment circuit.

12. The memory device as claimed in claim 11, wherein when the memory device is performing the access operation to the first memory cell, the first switch is turned on according to the address signal to pull the voltage at the reference node of the first memory cell to a voltage level of the ground, and wherein when the memory device is performing the access operation to the second memory cell, the first switch is turned off according to the address signal, and the first bias element pulls the voltage at the reference node of the first memory cell to a reference voltage level which is higher than the voltage level of the ground.

13. The memory device as claimed in claim 11, wherein the second voltage adjustment circuit comprises:
 a second switch coupled between the reference node of the second memory cell and the ground, controlled by the address signal;
 a second bias element coupled to the reference node of the second memory cell.

14. The memory device as claimed in claim 11, wherein when the memory device is performing the access operation to the first memory cell, the first switch is turned on according to the address signal to pull the voltage at the reference node of the first memory cell to a voltage level of the ground, and the second bias element pulls the voltage at the reference node of the second memory cell to a reference voltage level which is higher than the voltage level of the ground, and wherein when the memory device is performing the access operation to the second memory cell, the second switch is turned on according to the address signal to pull the voltage at the reference node of the second memory cell to the voltage level of the ground, and the first bias element pulls the voltage at the reference node of the first memory cell to the reference voltage level.

15. The memory device as claimed in claim 11, wherein the first and second voltage adjustment circuits are disposed between the plurality of first and second memory cells.

* * * * *